United States Patent [19]

Lin

[11] Patent Number: 5,621,692

[45] Date of Patent: Apr. 15, 1997

[54] MEMORY DEVICE WITH PAGE SELECT CAPABILITY

[75] Inventor: James J. Y. Lin, Hsinchu, Taiwan

[73] Assignee: Winbond Electronics Corporation, Taiwan

[21] Appl. No.: 516,611

[22] Filed: Aug. 18, 1995

Related U.S. Application Data

[62] Division of Ser. No. 248,520, May 24, 1994, Pat. No. 5,485,428.

[51] Int. Cl.$^6$ ..................................... G11C 7/00
[52] U.S. Cl. .................. 365/221; 365/238.5; 365/240
[58] Field of Search ............................. 365/221, 238.5, 365/240, 239, 233, 236

[56] References Cited

U.S. PATENT DOCUMENTS 4,044,339  8/1977  Berg ........................................ 365/240
4,873,671 10/1989  Kowshik et al. ................... 365/189.12
4,969,126 11/1990  Maeno .................................... 365/240
4,970,692 11/1990  Ali ...................................... 365/189.05
5,142,637  8/1992  Harlin ..................................... 365/221

FOREIGN PATENT DOCUMENTS

2005880   4/1979  United Kingdom ............ G06F 13/06

Primary Examiner—A. Zarabian
Attorney, Agent, or Firm—Fish & Richardson P.C.

[57] ABSTRACT

The invention provides a memory device having page select capability. The serial access memory device provided includes a first data terminal and a memory cell array having a plurality of address locations. The serial access memory device including a shift register, an address decode circuit and a page select device. The page select device, in response to the access control signal, the address clock signal and the clock signal, selectively stores a page number therein.

9 Claims, 9 Drawing Sheets

MEMORY DEVICE WITH PAGE SELECT CAPABILITY

This is a divisional of application Ser. No. 08/248,520, May. 24, 1994 U.S. Pat No. 5,485,428 Jan. 16, 1996.

TECHNICAL FIELD OF THE INVENTION

The invention relates to a memory device and, in particular, to an integrated circuit memory device with page select capability.

BACKGROUND OF THE INVENTION

To meet the need of the multi-medium computer system nowadays, the integrated circuit memory device has been recently used for storing huge amount of information such as voice and image information. The information such as voice or image has characteristics of continuity of data. In other words, those information are, most of the time, stored and retrieved sequentially or serially.

Figure 1A:
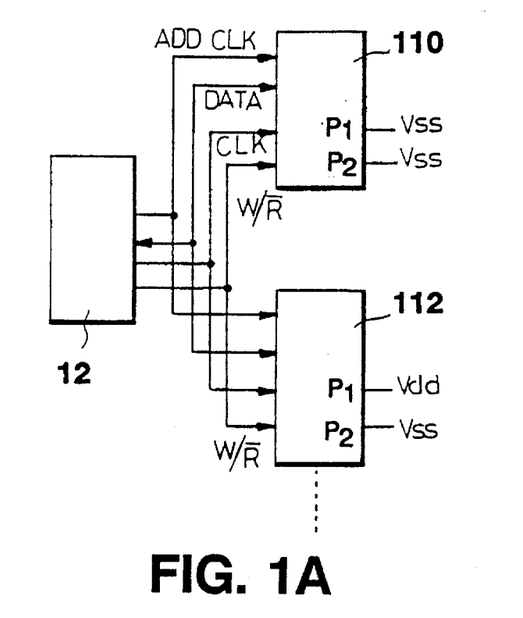
FIG. 1(a) shows a memory system configuration of a first type in accordance with the conventional art.

Typically, a memory system of a data processing system consists of a plurality of integrated circuit (IC) memory devices. For instance, in FIG. 1(a), a plurality of IC memory devices are shown to constitute a memory system to which a central processor unit (CPU) 12 is coupled within a data processing system. Under this kind of system configuration, it is required to have external pins, such as P1, P2, etc., to distinguish the different address range occupied by the individual memory device 110, 112, etc. As shown in FIG. 1(a), the Vss is coupled to P1, P2 pins of the first memory device 110 respectively indicative of a Page 0 of the address range being occupied by the first memory device 110, and the Vdd is coupled to the P1 pin while the Vss is coupled to P2 pin of the second memory device 112 indicative of a Page 1 of the address range being occupied by the second memory device 112. When only two pins P1, P2 are available for this purpose, the maximum number of the memory device used in the data processor system shown is four. The first drawback of this design relates to the extra page select pins, such as P1,P2, . . . etc., being required for each memory device in the system. The second drawback relates to the human mistake often occurred when connecting P1, P2 pins to the reference voltage Vdd, Vss.

Figure 1B:
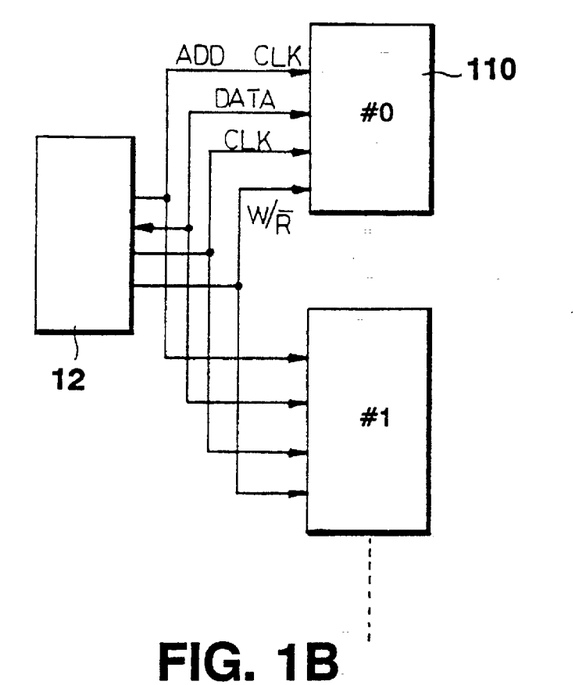
FIG. 1(b) shows a memory system configuration of a second type in accordance with the conventional art.

In order to avoid the above-mentioned drawbacks, some manufacturers burn the page number into the memory device label the page number thereon at the last stage of the manufacture process under the request of the users of the memory device. Therefore, each memory device as made has a fixed and unalterable page number therein as shown in FIG. 1(b). This approach, solving the issue associated with FIG. 1(a), creates new shortcomings. For instance, since the page number is fixed for each memory device, the manufacture has to stock a certain amount of the memory device with different page number which is detrimental to inventory management. For another instance, the system maker who implements the memory device with fixed page number in the system they make has to ensure the system as made does not include memory devices having same page number. Otherwise, the system would malfunction.

In order to solve the above-mentioned shortcomings of the conventional approaches, the invention provides a memory device with page select capability.

SUMMARY OF THE INVENTION

The serial access memory device provided has a first data terminal and a memory cell array having a plurality of address locations. The serial access memory device comprises a shift register, an address decode circuit and a page select device.

The shift register, responsive to an address clock signal, stores a first address value of a serial access memory operation. The shift register has a first input terminal coupled to the first data terminal.

The address decode circuit serially accesses the plurality of address locations of the memory cell array, responsive to an access control signal, the first address value, the address clock signal and a clock signal.

The page select device is coupled to the shift register, and, in response to the access control signal, the address clock signal and the clock signal, selectively stores a page number.

The spirit and further details of the invention will be further understood by the following detailed description of the invention along with the accompanied drawings.

DETAILED DESCRIPTIONS OF THE PREFERRED EMBODIMENTS OF THE INVENTION

Figure 2A:
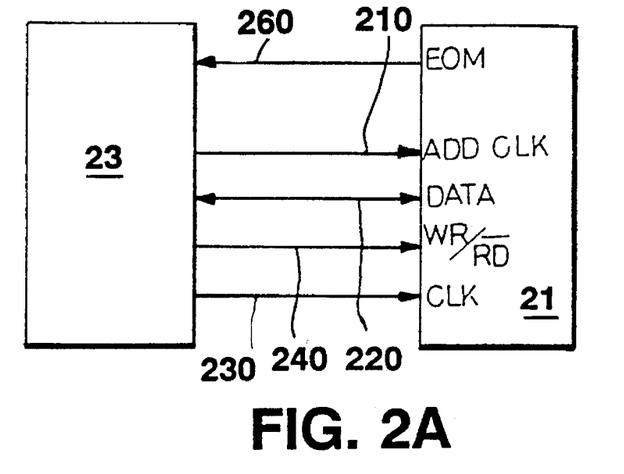
FIG. 2(a) shows a memory system configuration having only one memory device of the present invention.

As shown in FIG. 2(a), a serial access memory device 21 in accordance with the invention is coupled to a voice recorder controller 23. The information lines include a clock line (CLK) 230, an address clock (ADD CLK) line 210, a bidirection data line 220, a memory read/write (W/RD) line 240 and End of Memory (ECM) line 260. The memory read/write 240 line is a memory access control line.

Figure 2B:
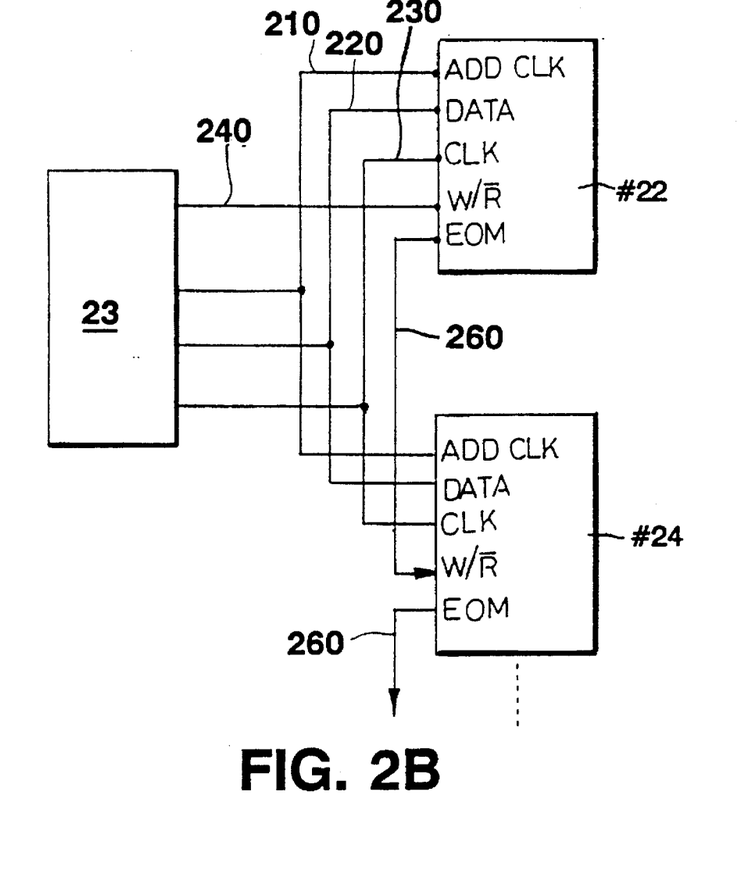
FIG. 2(b) shows a memory system configuration having a plurality memory devices of the present invention.

In FIG. 2(b) a serial access memory system is shown to couple with a central processor unit 23. The serial access memory system comprises a plurality of serial access memory devices 22, 24 . . . , each of the plurality of serial access memory devices being coupled to the other in cascade to form the serial access memory system. The plurality of serial access memory devices have a first memory device 22 and a last memory device 28 (not shown). Each serial access memory device has a memory cell array which has a plurality of address locations, and has an EOM terminal for sending art End of Memory signal when a last location of the memory cell array of each memory device is accessed, and has an access control input terminal (W/$\overline{R}$). The EOM terminal of each, except the last serial access memory device 28, of the plurality of serial access memory devices is coupled to the access control input terminal (W/$\overline{R}$) of the next serial access memory device in cascade to form the serial access memory system as shown in FIG. 2(b).

Figure 3:
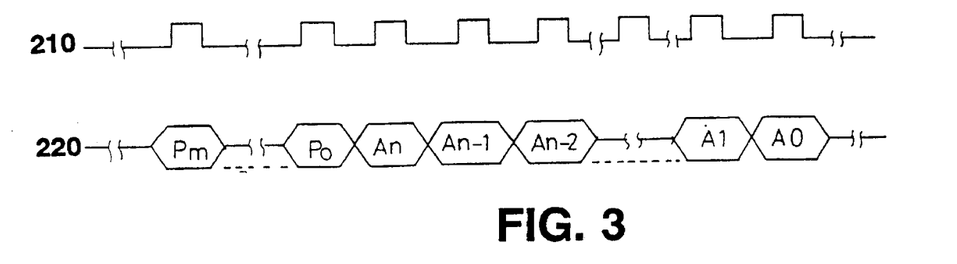
FIG. 3 shows the timing of the transmission of the first address value in accordance with the invention.

The data of the memory device 22, 24 . . . . etc., having a plurality of address locations are accessed serially through the data line 220. The data terminal (DATA) of the memory devices 22, 24 . . . . . etc., serially input a first address value of a serial access memory operation during a first period of time, and selectively serially transmits data during a rest period of time. The first address value contains information indicative of the page number within memory system to which the access operation corresponds. The timing of the transmission of the first address value through the data line 220 is disclosed in FIG. 3. The Pm . . . Po represents the page value accessed and the An . . . Ao represents the address value within the memory device having page value Pm . . . Po. In accordance with the invention, a memory device can not be read without being written into data previously, which will be understood thereinafter.

Figure 4:
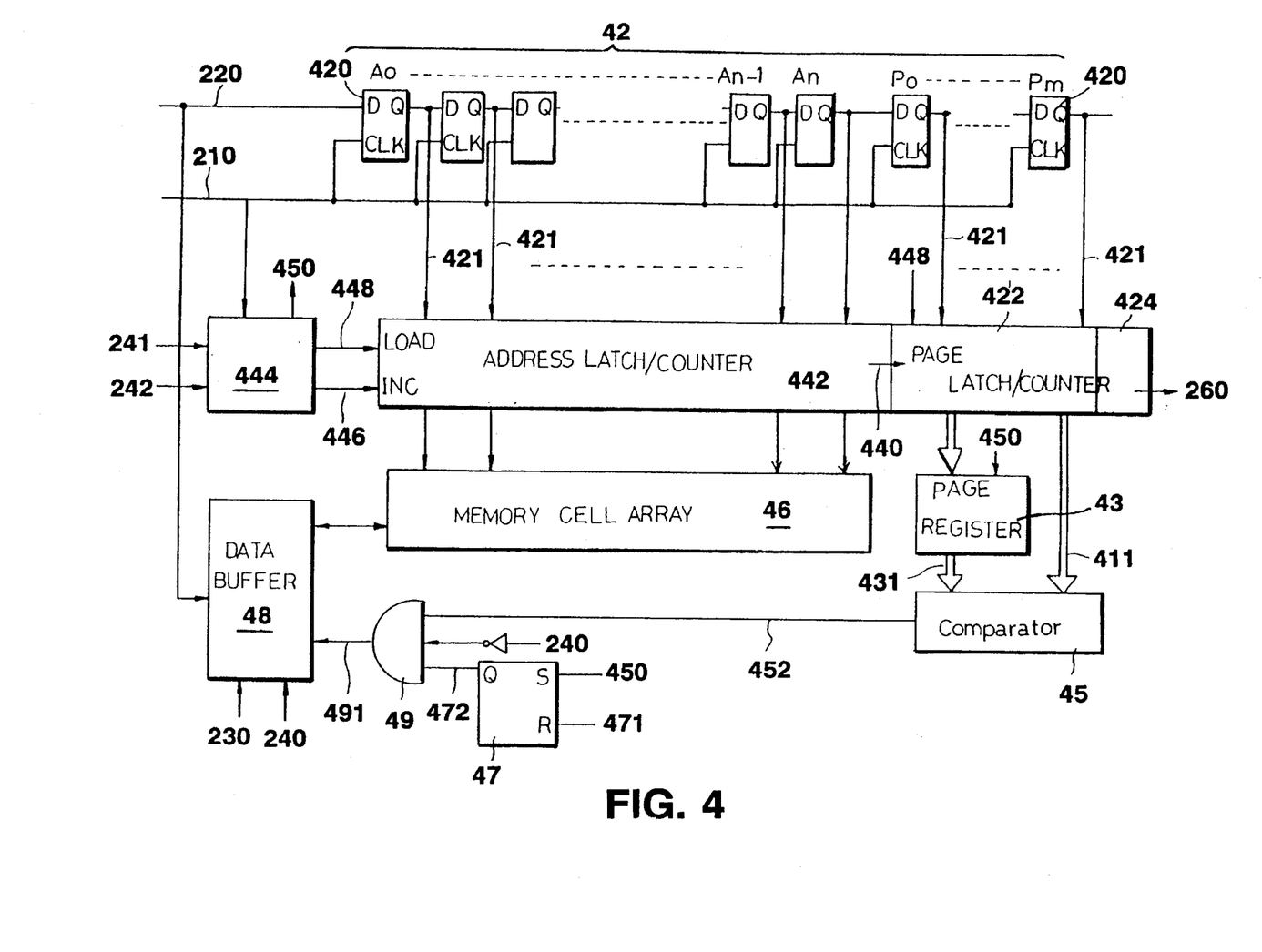
FIG. 4 shows one preferred embodiment of the detailed function of the serial access memory device of the invention.

As shown in FIG. 4, the serial access memory device of the invention has a shift register 42, in response to the address clock signal 210, storing the first address value of a serial access memory operation. The shift register 42 has a first input terminal coupled to the data terminal (DATA) of the memory device. The serial access memory device has an address decode circuit 44 which serially accesses the plurality of address locations of the memory cell array 46, in response to a write signal 241 and a read signal 242, the first address value 421, the address clock signal 210. The write signal 241 and the read signal 242 both relate to the clock signal 230 and the memory write/read signal 240 the details of which will be recited thereinafter.

The shift register 42 has N data registers 420 each of which being coupled together in series to form the shift register 42. Each of the N data registers has a data output terminal (Q), a clock input terminal (CLK) and a data input terminal (D). The data input terminal of a first data register of the N data registers is the first input terminal of the shift register 42 and is coupled to the data terminal (DATA). The clock input each data register is adapted to receive the address clock signal 210.

The address decode circuit 44 has an address latch/counter 442, which has N input terminals each of which coupled to the data output terminal (Q) of one corresponding data register 420, latching the first address value in response to a load signal 448, and incrementing the value of the address location accessed in response to an increment signal 446.

The address decode circuit 44 further comprises an edge detector 444 which, responsive to the memory read/write signal 240, the clock signal 230 and the address clock signal 210, generates the load signal 448, the increment signal 446 and a load page signal 450.

The memory device comprises a page select function which, responsive to the access control signal 240, the address clock signal 210 and the clock signal 230, selectively latches a page number.

The page select function has a page latch/counter 422 and a page register 43. The page latch/counter 422, which is coupled to the shift register 42, latches and stores a page value Pm . . . Po included within the first address value, in response to a load signal 448. The page latch/counter 422 increments by 1 as a page increment signal 440 is asserted. The page register 43, which has input coupled to an output of the page latch/counter 422, in response to a load page signal 450, stores the page number from the output of the page latch/counter 422. As recited, the value within the page latch/counter 422 of each memory device in the system shown in FIG. 2(b) increments by 1 as a page increment signal 440 is asserted by the address latch/counter 442.

The page select function further includes an access control function, which is adapted to receive the page number 431 of the page register 43 and a latch output 411 from the page latch/counter 422. In response to the access control signal 240, the access control function selectively transits the data corresponding to the plurality of address locations of each memory device in the memory system.

The access control function comprises a comparator 45, a set-rest flip-flop 47, art AND gate 49 and a data buffer 48. The comparator 45 generates an access signal 452 by comparing the page number 431 with the latch output 411. The access signal 452 is negated when the page number 431 is different from the latch output 411.

The set-reset flip-flop 47 has a set input terminal receiving the load page signal 450, has a reset input terminal receiving a power-on reset signal 471 and has a data output generating an allow-to-read signal 472.

The AND gate 49 has an output generating a buffer-enable signal 491, in response to the access signal 452, the allow-to-read signal 472 and the access control signal 240.

The data buffer 48, coupled to the data terminal of the memory device and the memory cell array 46 respectively, serially transmits the data in response to the access control signal 240, the buffer-enable signal 491 and the clock signal 230. When the access control signal 240 is asserted due to a memory write operation while the buffer-enable signal 491 is de-asserted, the data buffer 48 is still enable to allow the memory write operation.

As a first address value Pm . . . Po, An . . . Ao of a memory write operation is sent to the shift register 42 of each memory device 22, 24 in FIG. 2(b) via the data line 220 by the address clock signals 210, only the input to the W/$\overline{R}$ pin of the first memory device 22 is asserted. And the input to the W/$\overline{R}$ pins of other memory devices, such as 24 in FIG. 2(b), are all negated. Therefore as the first clock comes in via the clock line 230, the first memory device 22 treats the operation as a write operation and all other memory devices 24, . . . , etc, treats the operation as a read operation.

However, at the power-on of the data processor system, the power-on reset signal 471 will reset the flip-flop 47 of each memory device which pulls low the allow-to-read signal 472. In succession, this negated allow-to-read signal 472 pulls low the buffer-enable signal 491 such that the data buffer 48 of each memory device is prohibited to transmit the data. In other words, if the memory device 22, . . . 28 within the system have never been written after the system is powered on, all memory devices can not be read. As a result, when the first memory device 22 is being written into data, there are no operations for the rest of he memory devices in the system shown in FIG. 2(b), as long as no write operation has been done before.

The page select function further comprises a page boundary logic 424 which asserts an End of Memory signal 260 in response to the page increment signal 440 when a last address location of the memory cell array is written, and asserts the End of Memory signal 260 only for a short duration in response to the page increment signal 440 when a last address location of the memory cell array is read.

After the first address value is completely input to the shift register 42 indicated by the negated state of the address clock signal 210, the rising edge of the first clock signal on the clock line 230, during the period the access control signal (WR/$\overline{\text{RD}}$) being high, triggers an asserted load page signal 450 latching the page information output from the page latch/counter 422, for instance value 00, into the page register 43.

As a last address location of the memory device 22 is reached, only the End of Memory signal 260 of the memory device 22 is pulled high from low which forces the W/$\overline{\text{R}}$ pin of the second memory device 24 to be high. However, the asserted page increment signal 440 from address latch/counter 442 of each memory device automatically increment the value of page latch/counter 422 from 00 to 01 within each memory device in system. Therefore, the successive first clock signal on the clock line 230 will send an asserted load page signal 450 to load an update page number value 01 to the page register 43 of the second memory device 24. As the access of memory device 24 continues and a last address location of the second memory device 24 is reached, a next page number 10 will be loaded into the page register 43 of the third memory device 26, etc. The page selection function is therefore achieved by the invention.

Figure 5A:
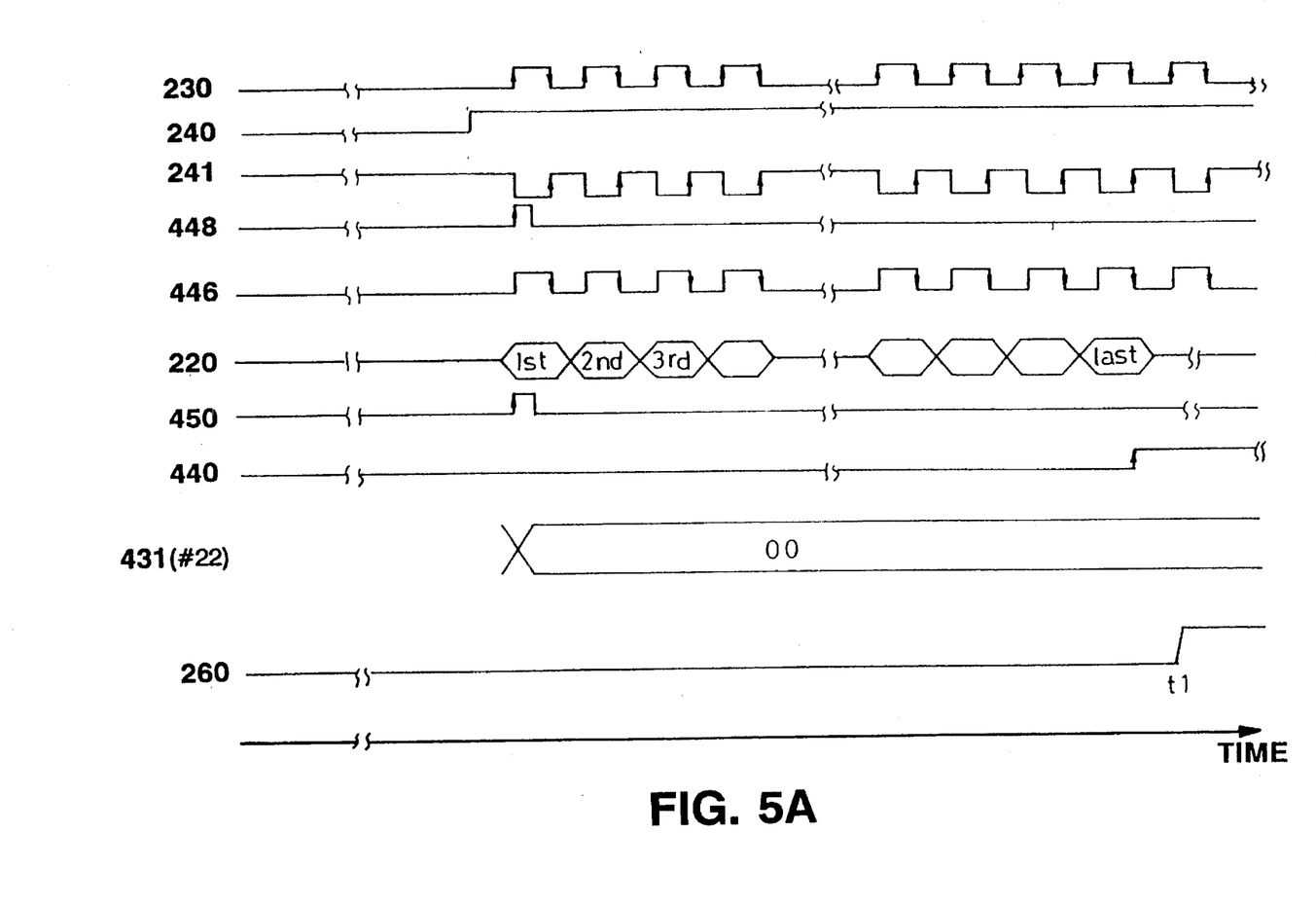
FIG. 5(a) shows the timing of a memory write operation of the memory device 22 in FIG. 2(b) in accordance with the invention.
Figure 5B:
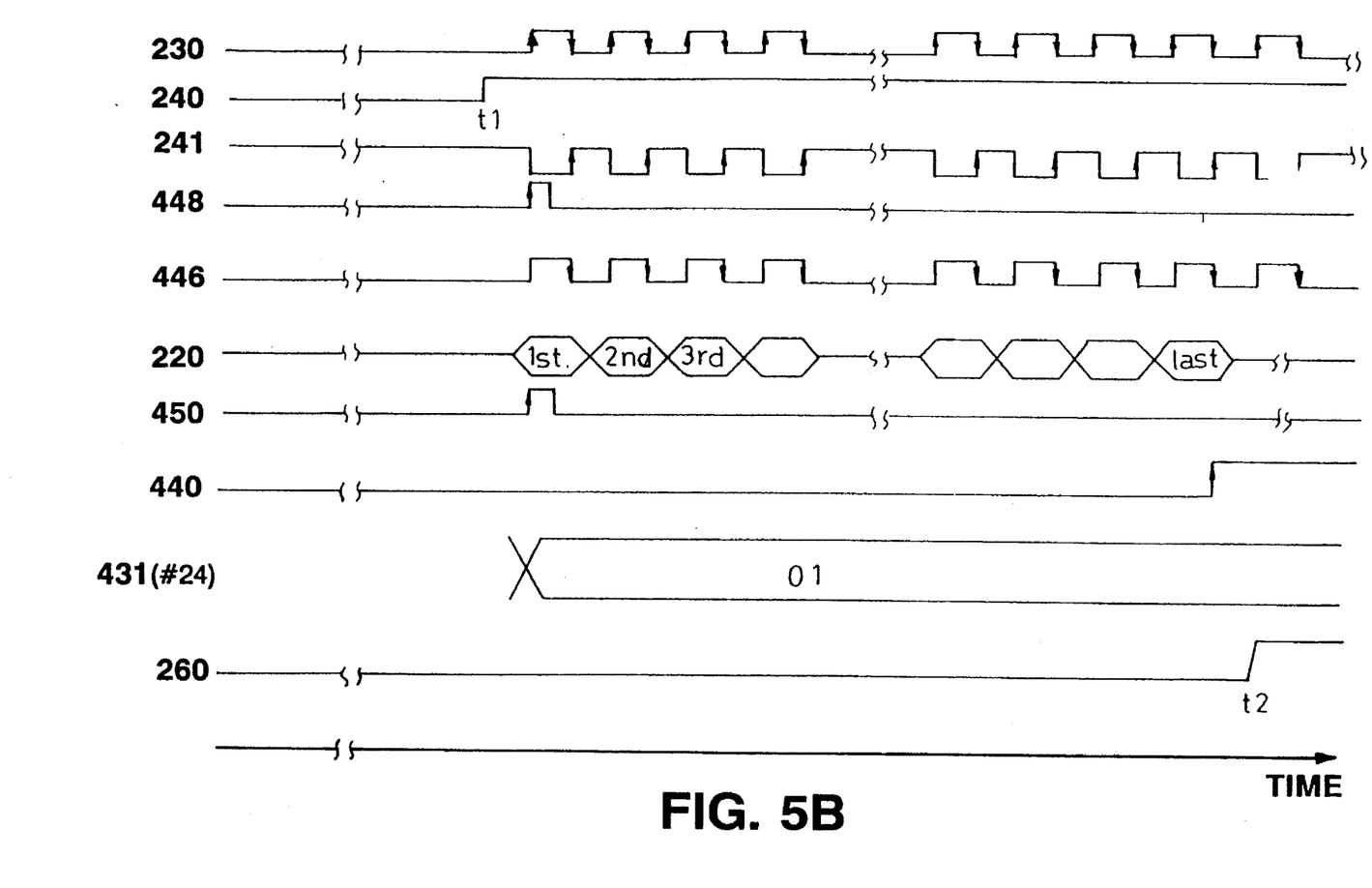
FIG. 5(b) shows the timing of a memory write operation of the memory device 24 in FIG. 2(b) in accordance with the invention when the write operation to the memory device 22 flips through a page boundary.

The timing of a memory write operation of the invention is shown in FIG. 5(a) in which it may be found when a last memory location is accessed, an End of Memory signal (EOM) 260 is asserted (high) to write more data into the next memory device 24. The timing in FIG. 5(b) shows the subsequent operation of the second memory device 24 in the memory system after the End of Memory signal 260 of the first memory device 22 is asserted. In the preferred embodiment shown in FIG. 5, the memory write operation is recognized when the memory WR/$\overline{\text{RD}}$ signal 240 is pulled high by the controller 23, and the memory read operation is recognized when the memory WR/$\overline{\text{RD}}$ signal 240 is pulled low by the controller 23.

After the data are written into a memory device 22 in the system, the data in the memory device 22 then my be read out by first sending a first address value of a memory read operation. It is to be understood, however, the load page signal 450 is not asserted for a memory read operation. Therefore, the value stored in the page register 43 will not be altered during memory read operation. In the preferred embodiment shown in FIG. 4, the current page number 411 in the page latch/counter 422 of each memory device will be compared with the value 431 in the page register 43 of each memory device. If two values do not match, the access signal 452 is negated such that a negated bufferenable signal 491 is resulted. When the access control signal 240 indicates a memory write, the data buffer 48 would still be enabled to transmit the data regardless of the status of the buffer-enable signal 491. However, when the access control signal 240 indicates a memory read, the data buffer 48 is disable not to transmit the data of this memory device if the bufferenable signal 491 is de-asserted.

As two values match for a particular memory device 22, for instance, this particular memory device 22 has a page number 431 same as that stored in the page latch/counter 422. The data within the memory cell array 46 of this particular memory device 22 are therefore read out via the data line 220. As the memory read operation continues and a last address location of each memory device is reached, the value 411 in the page latch/counter 422 will be incremented by one. The value 431 does not equal to the value 411 any more for the memory device 22, and it is disabled not to output the data therein. However, the value 431 of the page register 43 for the next memory device 24 becomes equal to the update value 411, and therefore the memory device 24 is enabled to transmit the data therein.

Figure 5C:
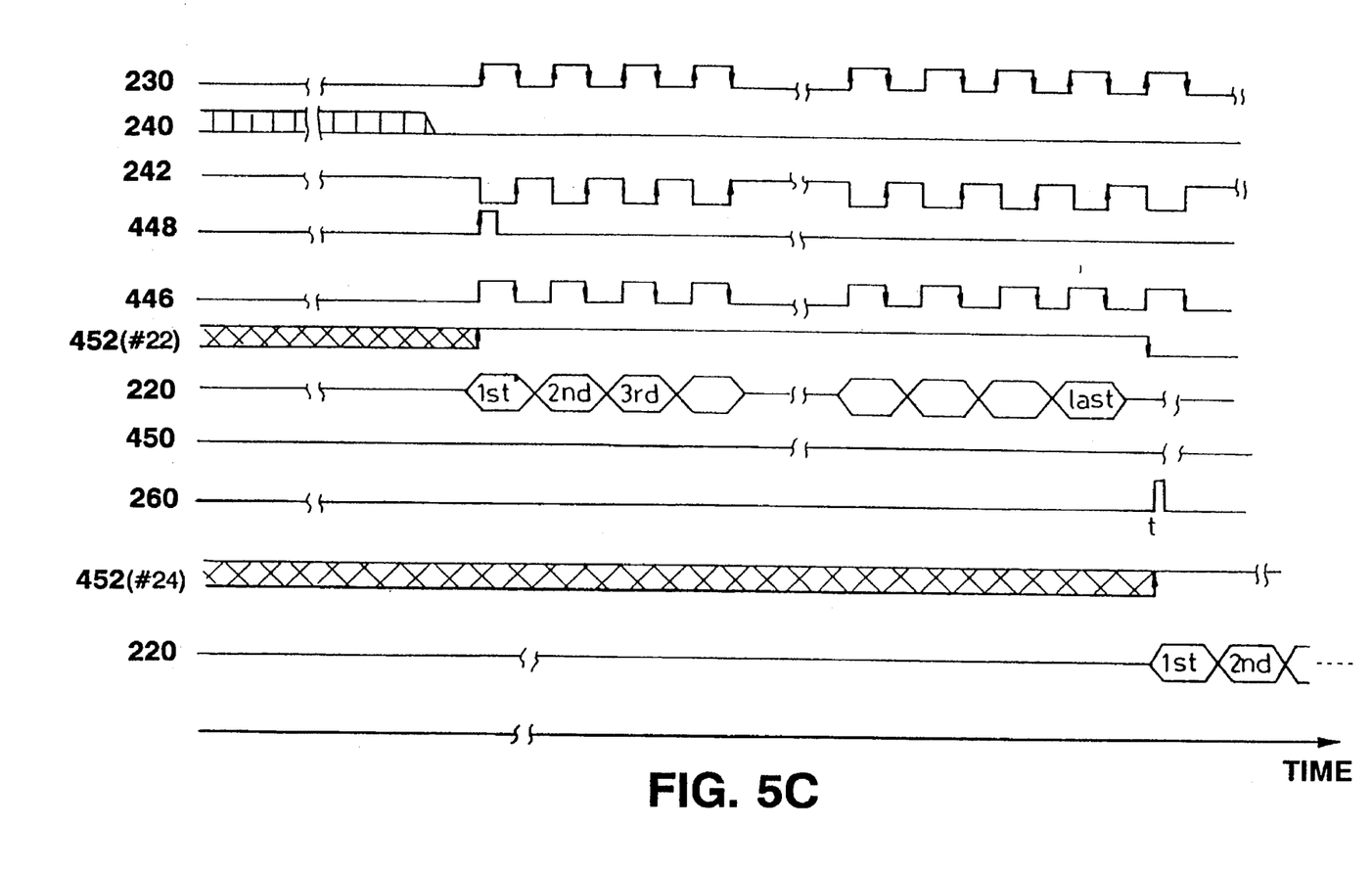
FIG. 5(c) shows the timing of a memory read operation of the memory device 22 in FIG. 2(b) which has been written into data previously according to the invention.

The timing of a memory read operation of the invention is shown in FIG. 5(c) in which it may be found when all corresponding data have been transmitted, a pulse with short duration is asserted on the End of Memory signal line 260.

Figure 6A:
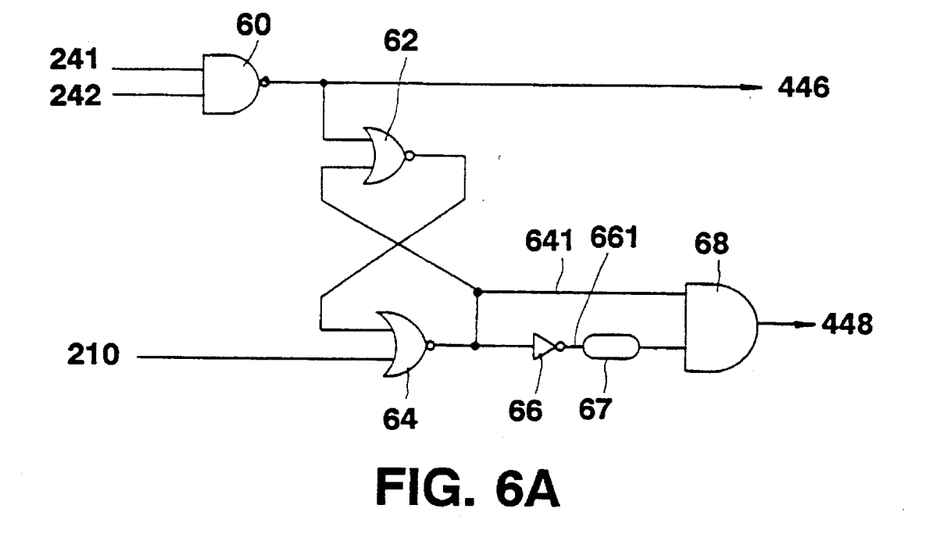
FIG. 6(a) shows a detailed circuit of the edge detector function in FIG. 4 associating with the load signal 448 and the increment signal 446.
Figure 6B:
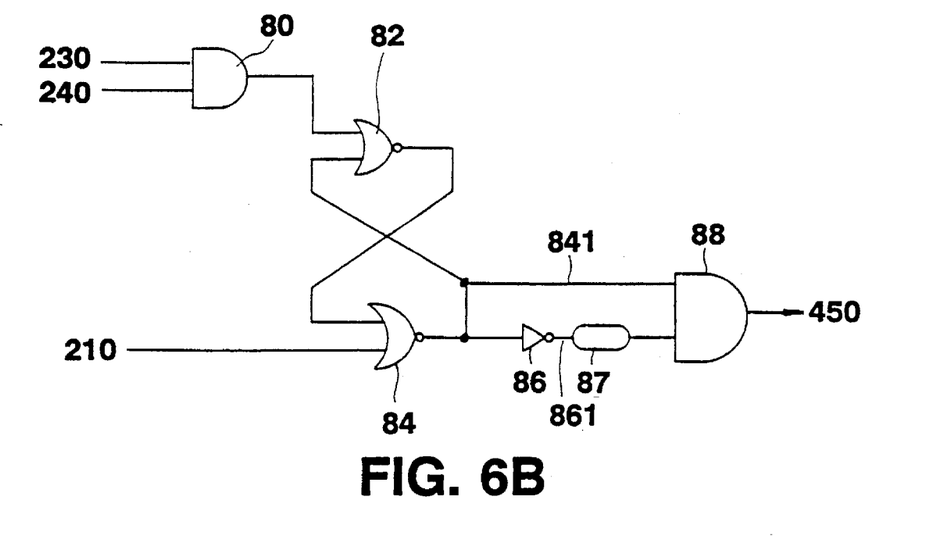
FIG. 6(b) shows a detailed circuit of the edge detector function in FIG. 4 associating with the load page signal 450.

The circuit of the edge detector 444 generating the increment signal 446 and load signal 448, shown in FIG. 6(a), has a NAND gate 60, a first NOR gate 62, a second NOR gate 64, an inverter 66, a delay line 67 and art AND gate 68. The NAND gate 60 has two inputs receiving a read signal 242 and a write signal 241 respectively, and has an output generating the increment signal 446. The first NOR gate 62 has a first input, a second input and a first output. The first input receives the increment signal 446. The second NOR gate 64 has a third input, a fourth input and a second output. The third input receives the address clock signal 210, the fourth input is coupled to the first output of the first NOR gate 62, and the second output is coupled to the second input of the first NOR gate 62 and generates a second output signal 641. The inverter 66 has a fifth input and a third output. The fifth input is coupled to the second output of the second NOR gate 64 and the third output generates a third output signal 661. The AND gate 68, in response to the second output signal 641 and third output signal 661, generates the load signal 448.

The circuit of the edge detector 444 generating the load page signal 450, shown in FIG. 6(a), has an AND gate 80, a first NOR gate 82, a second NOR gate 84, an inverter 86, a delay line 87 and art AND gate 88. The AND gate 80 has two inputs receiving the clock signal 230 and the memory read/write signal 240 respectively, and has an output. The first NOR gate 82 has a first input, a second input and a first output. The first input couples the output of the AND gate 80. The second NOR gate 84 has a third input, a fourth input and a second output. The third input receives the address clock signal 210, the fourth input is coupled to the first output of the first NOR gate 82, and the second output is coupled to the second input of the first NOR gate 82 and generates a second output signal 841. The inverter 86 has a fifth input and a third output. The fifth input is coupled to the second output of the second NOR gate 84 and the third output generates a third output signal 861. The AND gate 88, in response to the second output signal 841 and third output signal 861, generates the load page signal 450.

Figure 7:
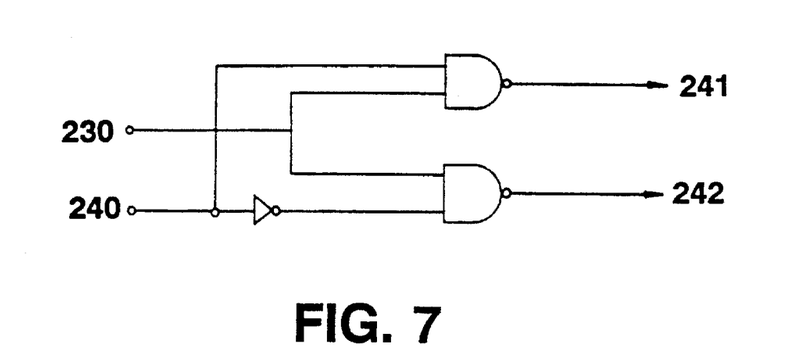
FIG. 7 shows how the write signal 241 and read signal 242 are generated from the clock signal 230 and the access control signal 240.

From FIG. 7, it is shown that the write signal 241 is generated by NANDing the clock signal 230 and the memory read/write signal (WR/$\overline{\text{RD}}$) 240, and the read signal 242 is generated by NANDing the clock signal 230 and the inverting signal of the memory read/write signal 240.

Figure 8:
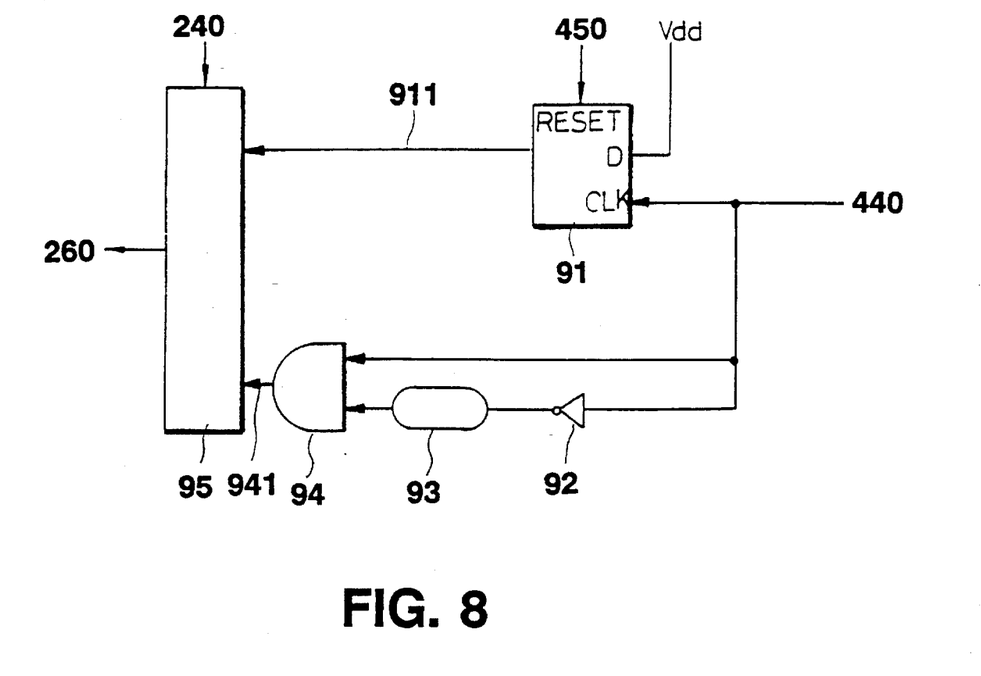
FIG. 8 shows the circuit from which the End of Memory signal 260 is generated.

As shown in FIG. 8, the circuit for generating the End of Memory signal 260 includes a flip-flop 91, an inverter 92, a delay line 93, an AND gate 94 and a multiplexer 95. As the access control signal 240 indicates a memory write, the signal 911 is transmitted to EOM signal 260 via multiplexer 95. As the access control signal 240 indicates a memory read, the signal 941 is transmitted to EOM signal 260 via multiplexer 95. The reset terminal and the CLK terminal of the flip-flop 91 receives the load page 450 and the page increment 440 signals respectively. The data terminal of the flip-flop 91 is coupled to the Vdd. The page increment signal 440 is also fed to the AND gate 94 and the inverter 92 as shown.

With the disclosed first preferred embodiment, the invention provides the following advantages over the conventional arts.

First, as a result of the page selection function of the invention, a plurality of serial access memory devices with small memory capacity may be coupled in cascade together to form a memory system with much larger memory capacity.

Second, one DATA line 210 and one address clock line 210 are only required to access the memory cell array 21 serially at a competitive access speed.

Third, the interface pins between the controller 23 and the integrated circuit memory device of the invention are kept the same no matter what size the memory device is, i.e. 256K, 1M, etc.

Fourth, the built-in page boundary logic within the memory device will output a End of Memory signal 260 to the controller 23 as a last address location is accessed. There is no need to implement the select signals M1, M2 indicating the memory type (size) used thereby saving more pins.

The detailed blocks of the preferred embodiments of the invention aforesaid are illustrative rather than limiting. Any equivalent modifications, substitutes, alterations or changes to the preferred embodiment without departing from the spirit of the invention are likely to the persons ordinary skill in the art, and are still within the intended scope of the protection of the invention which is defined by the following claims.

What is claim is:

1. A serial access memory system, comprising:
    a plurality of serial access memory devices, each of the plurality of serial access memory devices being coupled to each other in cascade to form the serial access memory system, the plurality of serial access memory devices having a first and a last serial access memory device, each of the plurality of serial access memory devices having a memory cell array which has a plurality of address locations, having an EOM terminal for sending an End of Memory signal when a last location of the memory cell array is accessed and having an access control input, the EOM terminal of each, except the last serial access memory device, of the plurality of serial access memory devices being coupled to the access control input of the other serial access memory in cascade to form the serial access memory system.

2. The serial access memory system as recited in claim 1, wherein the serial access memory device having a first data terminal, and the serial access memory device comprising:
    a shift register, in response to an address clock signal, for storing a first address value of a serial access memory operation, the shift register having an input terminal coupled to the first data terminal;
    an address decode circuit for serially accessing the plurality of address locations of said memory cell array, in response to an access control signal, the first address value, the address clock signal and the clock signal; and
    a page select means, coupled to the shift register, and in response to the access control signal, the address clock signal and the clock signal, for selectively storing a page number.

3. The memory device as recited in claim 2, wherein the page select means comprising:
    a page latch/counter, coupled to the shift register, for latching a page value included within the first address value in response to a load page signal, and the page latch/counter incrementing by 1 in response to a page increment signal;
    a page register, having input coupled to an output of the page latch/counter, and in response to a load page signal, for storing the page number.

4. The memory device as recited in claim 3, wherein the page select means further comprising:
    an access control means, adapted to receive the page number of the page register and a latch output from the page latch/counter, and in response to the access control signal, for selectively transmit the data corresponding to the plurality of address locations accessed serially.

5. The memory device as recited in claim 4, wherein the access control means comprising:
    a comparator for comparing the page number with the latch output to generate an access signal.

6. The memory device as recited in claim 5, wherein the access control means further comprising:
    a set-reset flip-flop, having a set input terminal receiving the load page signal, having a reset input terminal receiving a power-on reset signal and having a data output generating an allow-to-read signal.

7. The memory device as recited in claim 6, wherein the access control means further comprising:
    an AND gate, in response to the access signal, the allow-to-read signal and the access control signal, for generating a buffer-enable signal.

8. The memory device as recited in claim 7, wherein the access control means further comprising:
    a data buffer, coupled to the data terminal and the memory cell array respectively, for serially transmitting the data in response to the access control signal, the buffer-enable signal and the clock signal.

9. The memory device as recited in claim 3, wherein the page select means further comprising a page boundary logic for asserting an End of Memory signal in response to the page increment signal when a last address location of the memory cell array is written, and for asserting the End of Memory signal only for a short duration in response to the page increment signal when a last address location of the memory cell array is read.

* * * * *